(12) United States Patent
Yuan

(10) Patent No.: US 10,641,791 B2
(45) Date of Patent: May 5, 2020

(54) INSTRUMENT KNOB BACKLIGHT STRUCTURE AND INSTRUMENT

(71) Applicant: SHENZHEN EVERBEST MACHINERY INDUSTRY CO., LTD., Shenzhen, Guangdong (CN)

(72) Inventor: Jianmin Yuan, Guangdong (CN)

(73) Assignee: SHENZHEN EVERBEST MACHINERY INDUSTRY CO., LTD., Shenzhen, Guangdong (CN)

( * ) Notice: Subject to any disclaimer, the term of this patent is extended or adjusted under 35 U.S.C. 154(b) by 160 days.

(21) Appl. No.: 15/755,920

(22) PCT Filed: Oct. 16, 2015

(86) PCT No.: PCT/CN2015/092110
§ 371 (c)(1),
(2) Date: Feb. 27, 2018

(87) PCT Pub. No.: WO2017/035925
PCT Pub. Date: Mar. 9, 2017

(65) Prior Publication Data
US 2018/0356443 A1    Dec. 13, 2018

(30) Foreign Application Priority Data

Aug. 31, 2015   (CN) ..................... 2015 2 0668426 U

(51) Int. Cl.
*F21V 33/00*      (2006.01)
*G01R 1/02*       (2006.01)
(Continued)

(52) U.S. Cl.
CPC ............... *G01R 1/025* (2013.01); *G01R 1/04* (2013.01); *G02B 6/0091* (2013.01); *G02B 6/0095* (2013.01)

(58) Field of Classification Search
CPC ........................... H01H 2219/062; H04M 1/22
See application file for complete search history.

(56) References Cited

U.S. PATENT DOCUMENTS 7,455,416 B2    11/2008  Chen
2001/0021107 A1  9/2001  Funamoto
(Continued)

FOREIGN PATENT DOCUMENTS

CN    202075319 U    12/2011
CN    202696567 U     1/2013
(Continued)

OTHER PUBLICATIONS

International Search Report (English and Chinese) and Written Opinion issued in International Application No. PCT/CN2015/092110, dated May 25, 2016, 10 pages.

*Primary Examiner* — Andrew J Coughlin
(74) *Attorney, Agent, or Firm* — Hamre, Schumann, Mueller & Larson, P.C.

(57) ABSTRACT

The present application is suitable for the field of instrument, and provides an instrument knob backlight structure and an instrument, wherein the instrument knob backlight structure comprises a housing, a knob provided outside the housing, a index dial provided on the periphery of the knob, and a backlight module mounted inside the housing and provided adjacent to the index dial, wherein the backlight module comprises a light source component, a light-transmittable element and a light guide provided between the light source component and the light-transmittable element, and the index dial is provided on the outer surface of the light-transmittable element facing outward of the housing. The present application emits light through the light source component and conducts and irradiates the light ray emitted by the light source component to the light-transmittable element through the light guide, so that the light ray can pass (Continued)

through the light-transmittable element to generate a uniform backlight at the index dial. In this way, operators can clearly see the identification character on the index dial and the directing position of the knob in a dark environment, so that operators can still use the instrument in a dark environment and it is beneficial to improving the aesthetic appearance of the instrument.

8 Claims, 4 Drawing Sheets

(51) Int. Cl.
      *G01R 1/04*       (2006.01)
      *F21V 8/00*       (2006.01)

(56)       References Cited

U.S. PATENT DOCUMENTS

2002/0075668 A1*   6/2002   Dorrie ................ H01H 19/025
                                                               362/23.04
2006/0203485 A1    9/2006   Fu et al.

FOREIGN PATENT DOCUMENTS

| CN | 203456358 U | 2/2014 |
|---|---|---|
| CN | 103645772 A | 3/2014 |

\* cited by examiner

INSTRUMENT KNOB BACKLIGHT STRUCTURE AND INSTRUMENT

TECHNICAL FIELD

The present application pertains to the field of instruments, and in particular to an instrument knob backlight structure and an instrument having the instrument knob backlight structure.

BACKGROUND

In the conventional art, there is no backlight structure at the index dial of an instrument, such as a multimeter and a clamp meter. In this way, operators cannot clearly see the index dial on the instrument in a dark environment, which seriously affects the use and operation of instruments by operators and ultimately causes operators to be incapable of normally using instruments in a dark environment.

SUMMARY

An object of the present application is to overcome the above shortcomings of the conventional art and to provide an instrument knob backlight structure and an instrument, which solves the technical problem that the existing instrument cannot be normally used in a dark environment.

In order to achieve the above object, the technical scheme adopted by the present application lies in: an instrument knob backlight structure, comprising a housing, a knob provided outside the housing, a index dial provided on the periphery of the knob, and a backlight module mounted inside the housing and provided adjacent to the index dial, wherein the backlight module comprises a light source component, a light-transmittable element and a light guide provided between the light source component and the light-transmittable element, and the index dial is provided on the outer surface of the light-transmittable element facing outward of the housing.

Preferably, the housing is provided with a mounting opening, and the light-transmittable element is snapped and positioned in the mounting opening.

Preferably, the light-transmittable element comprises an outer ring light-transmittable substrate that is snapped in the mounting opening and a boss that extends along the outer ring light-transmittable substrate toward the inside of the housing, and the index dial is provided on the outer surface of the outer ring light-transmittable substrate facing outward of the housing.

Preferably, the light guide comprises a ring-shaped light guide substrate sleeved outside of the boss and provided opposite to the outer ring light-transmittable substrate, and a positioning lug protruding from the periphery of the ring-shaped light guide substrate.

Preferably, the light source component comprises a circuit board and an LED lamp provided on the circuit board, and the circuit board is fastened to the housing by several fasteners and compresses the light guide.

Preferably, the circuit board comprises a ring-shaped circuit substrate sleeved outside of the boss and several connecting lugs protruding from the periphery of the ring-shaped circuit substrate at intervals, the LED lamp is provided on the ring-shaped circuit substrate, and the fastener is fastened to the housing through the connecting lugs and the positioning lug.

Preferably, three connecting lugs and three fasteners are provided, and one positioning lug is provided, in which one of the fasteners is fastened to the housing through one of the connecting lugs and the positioning lug, and two other fasteners are fastened to the housing through two other connecting lugs, respectively.

Preferably, the housing comprises a front housing having a cavity and a rear cover mounted on the rear side of the front housing in a covering manner, the backlight module is mounted in the cavity, and the knob and the index dial are exposed on a front surface of the front housing opposite to the rear cover.

The instrument knob backlight structure provided by the present application adds a backlight module in the housing, and specifically, emits light through the light source component and conducts and irradiates the light ray emitted by the light source component to the light-transmittable element through the light guide, so that the light ray can pass through the light-transmittable element to generate a uniform backlight at the index dial. In this way, operators can clearly see the identification character on the index dial and the directing position of the knob in a dark environment, so that operators can still use the instrument in a dark environment and it is beneficial to improving the aesthetic appearance of the instrument.

Further, the present application also provides an instrument, which has the instrument knob backlight structure described above.

Preferably, the instrument is a multimeter or a clamp meter.

The instrument provided by the present application may facilitate the use of the instrument in a dark environment and improve the aesthetic appearance of the instrument because of adopting the instrument knob backlight structure described above.

DESCRIPTION OF THE EMBODIMENTS

In order to make the objectives, technical solutions and advantages of the present application clearer, the present application will be further described in detail with reference to the accompanying drawings and embodiments. It should be understood that the specific embodiments described herein are only used to explain the present application, and are not intended to limit the present application.

It should be noted that when an element is referred to as being "fixed on" or "provided on" another element, the element may be directly located on the other element or there may be an intermediate element at the same time. When an element is referred to as being "connected to" another element, the element may be directly connected to the other element or there may be an intermediate element at the same time.

It should also be noted that the orientation terms such as left, right, up, down, top, and bottom in the following embodiments are merely concepts relative to each other or are referenced to the normal usage state of a product, and should not be considered as be limitative.

Figure 1:
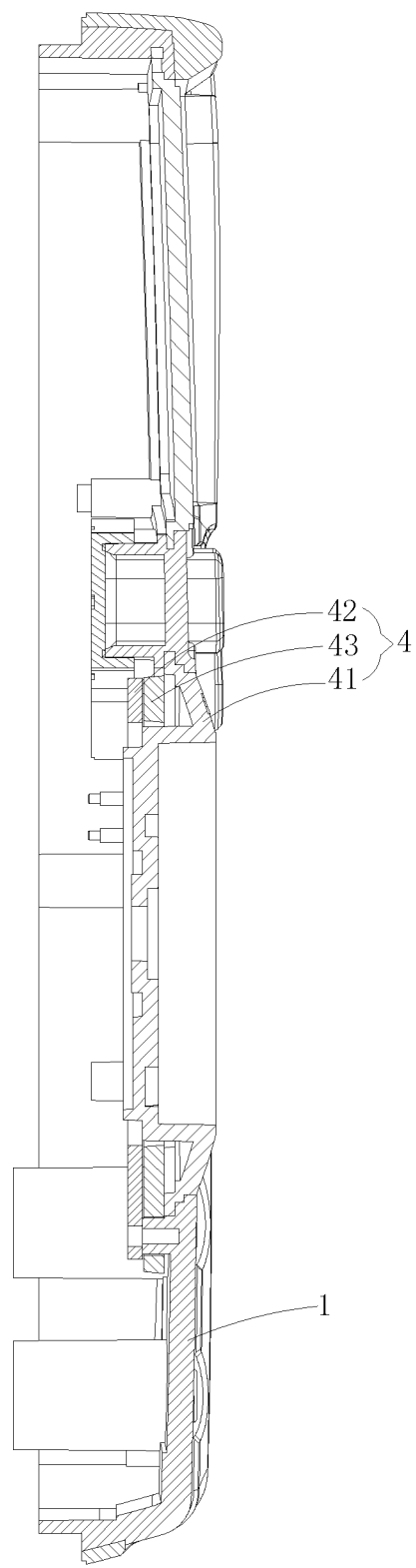
FIG. 1 is a cross-sectional schematic view of the assembly of a backlight module and a front housing provided by an embodiment of the present application.
Figure 2:
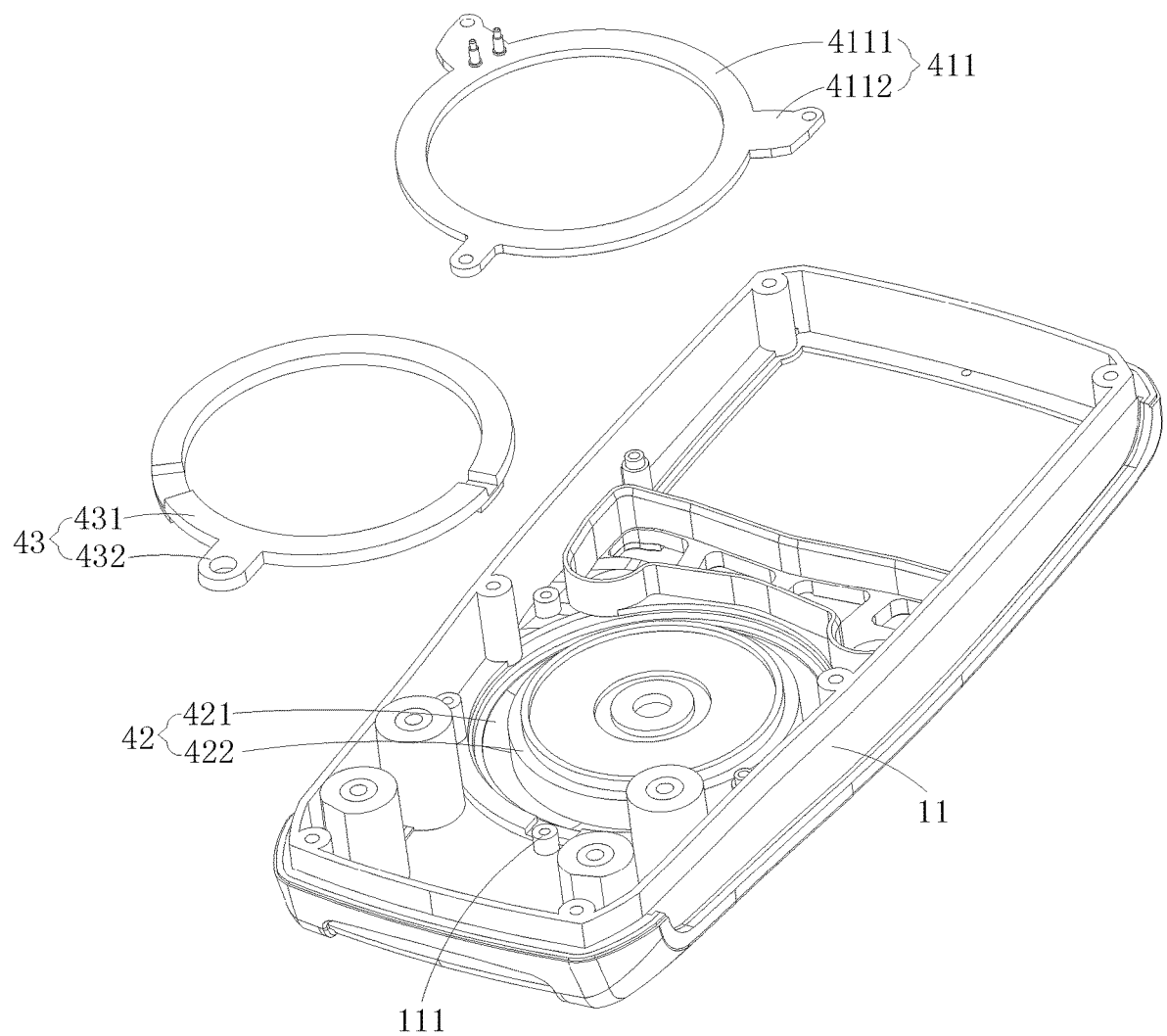
FIG. 2 is an exploded schematic view of a backlight module and a front housing provided by an embodiment of the present application.
Figure 3:
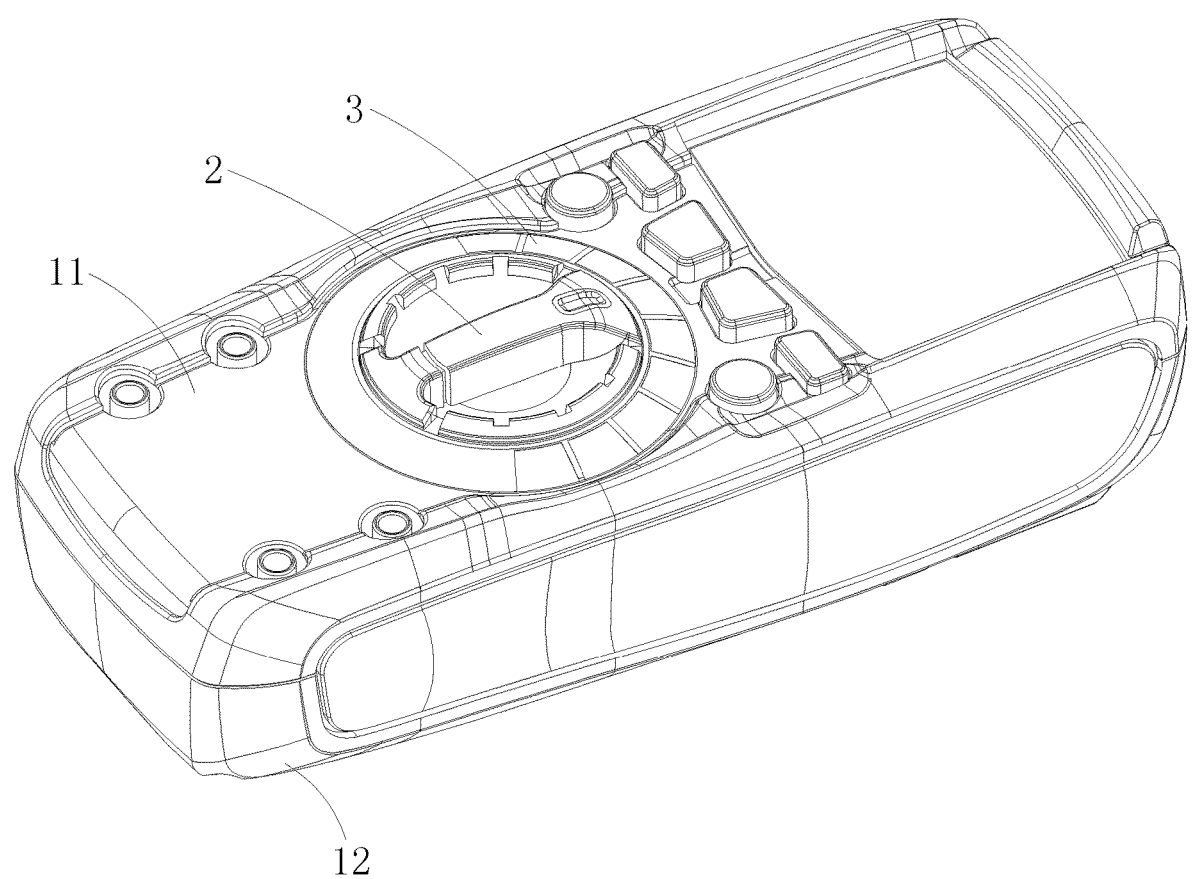
FIG. 3 is a perspective schematic view of an instrument provided by an embodiment of the present application.
Figure 4:
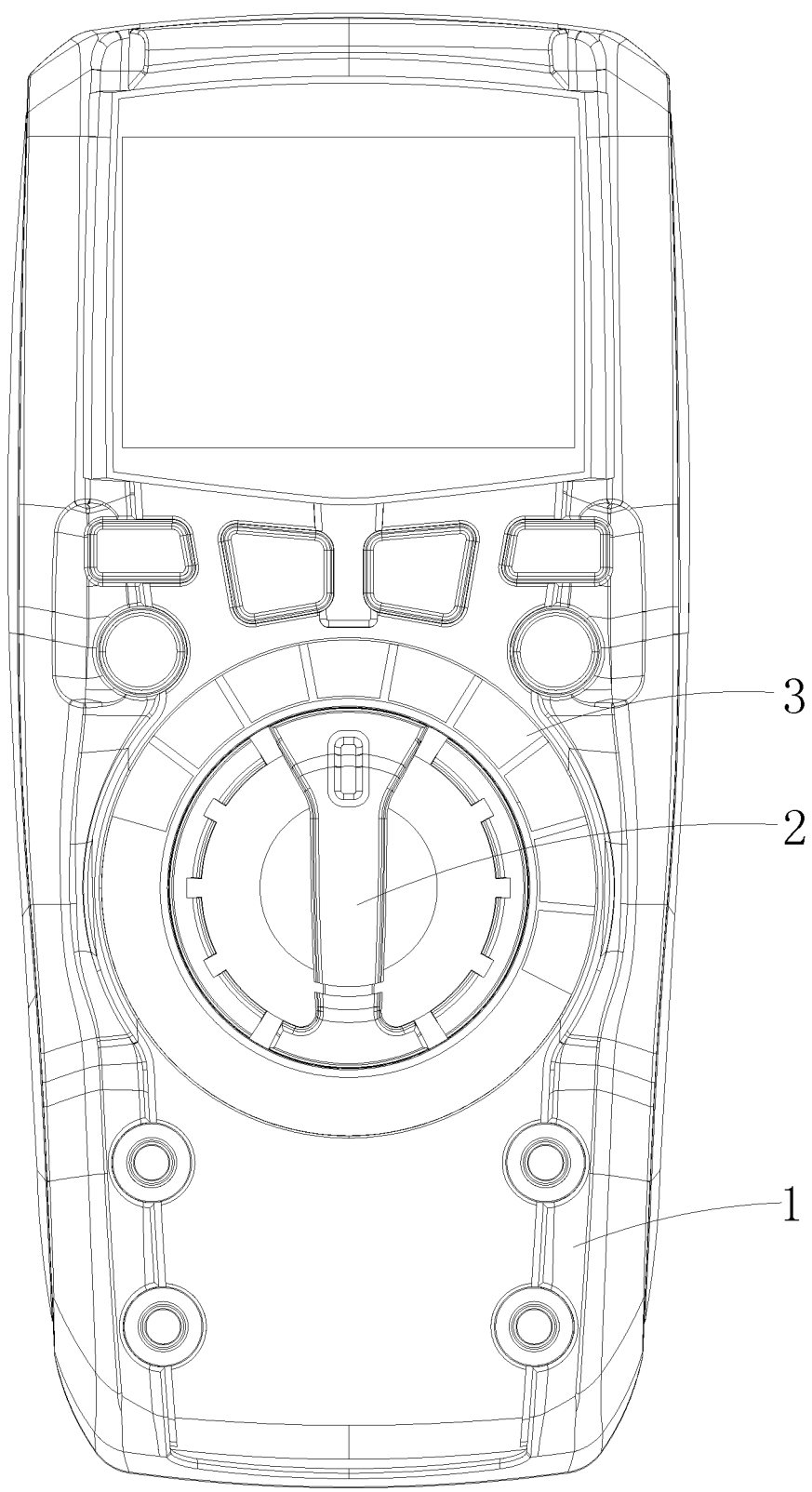
FIG. 4 is a top plan schematic view of an instrument provided by an embodiment of the present application.

As shown in FIGS. 1-4, the instrument knob backlight structure provided by an embodiment of the present application comprises a housing 1, a knob 2 provided outside the housing 1, a index dial 3 provided on the periphery of the knob 2, and a backlight module 4 mounted inside the housing 1 and provided adjacent to the index dial 3, wherein the backlight module 4 comprises a light source component 41, a light-transmittable element 42 and a light guide 43 provided between the light source component 41 and the light-transmittable element, and the index dial 3 is provided on the outer surface of the light-transmittable element 42 facing outward of the housing 1. The index dial 3 is provided with several identification character segments (not shown) provided at intervals. By turning the knob 2, the knob 2 may be directed to different identification character segments, respectively. In specific applications, the index dial 3 may be formed in a manner of directly marking or printing identification character segments on the outer surface of the light-transmittable element 42. Alternatively, the index dial 3 may also be formed in a manner of sticking label paper or a label tab marked or printed with identification character segments on the outer surface of the light-transmittable element 42. The instrument knob backlight structure provided by the present application adds a backlight module 4, and specifically, emits light through the light source component 41 and conducts and irradiates the light ray emitted by the light source component 41 to the light-transmittable element 42 through the light guide 43, so that the light ray can pass through the light-transmittable element 42 to generate a uniform backlight at the index dial 3. In this way, operators can clearly see the character on the index dial 3 and the directing position of the knob 2 in a dark environment, so that operators can still use the instrument in a dark environment and it is beneficial to improving the aesthetic appearance of the instrument.

Specifically, the light-transmittable element 42 may be a transparent plastic part. In specific applications, each of the identification character segments on the index dial 3 may be in a completely transparent state. Alternatively, each of the identification character segments on the index dial 3 may be in a semi-transparent state in a manner of partially coating opaque material on the light-transmittable element 42.

Preferably, the housing 1 is provided with a mounting opening, and the light-transmittable element 42 is snapped and positioned in the mounting opening. The present application is simple in structure and convenient in mounting, and facilitates the light ray to pass through the light-transmittable element 42 to generate a uniform backlight at the index dial 3.

Preferably, the light-transmittable element 42 comprises an outer ring light-transmittable substrate 421 that is snapped in the mounting opening and a boss 422 that extends along the outer ring light-transmittable substrate 421 toward the inside of the housing 1, and the index dial 3 is provided on the outer surface of the outer ring light-transmittable substrate 421 facing outward of the housing 1. The light-transmittable element 42 has a cavity extending from the hollow portion of the outer ring light-transmittable substrate 421 onto the boss 422. The knob 2 is rotatably mounted in the cavity. In this way, it is beneficial to improving the structural compactness of the product.

Preferably, the light guide 43 comprises a ring-shaped light guide substrate 431 sleeved outside of the boss 422 and provided opposite to the outer ring light-transmittable substrate 421, and a positioning lug 432 protruding from the periphery of the ring-shaped light guide substrate 431. The ring-shaped light guide 431 is provided, so that on the one hand, the light conducted and emitted from the light guide 43 may be more fully irradiated onto the ring-shaped light-transmittable substrate, and on the other hand, it is beneficial to reducing the material cost of the light guide 43. The positioning lug 432 is provided so as to achieve the mounting and positioning of the light guide 43 in the housing 1.

Preferably, the light source component 41 comprises a circuit board 411 and an LED lamp (not shown) provided on the circuit board 411. The LED lamp is small in volume, good in energy-saving effect, good in environmental protection performance and easy to control. The circuit board 411 is fastened to the housing 1 by several fasteners (not shown) and compresses the light guide 43. The fastener may be a screw, a rivet, etc. Here, the fastener is preferably a screw, which is convenient to disassemble and assemble and reliable in fastening.

Preferably, the circuit board 411 comprises a ring-shaped circuit substrate 4111 sleeved outside of the boss 422 and several connecting lugs 4112 protruding from the periphery of the ring-shaped circuit substrate 4111 at intervals, the LED lamp is provided on the ring-shaped circuit substrate 4111, and the fastener is fastened to the housing 1 through the connecting lugs 4112 and the positioning lug 432. The ring-shaped circuit substrate 4111 is provided so as to both achieve the compact positioning of the ring-shaped light guide substrate 431 and facilitate reducing the material cost of the circuit board 411. The connecting lugs 4112 are provided to mainly achieve the mounting and positioning of the circuit board 411 in the housing 1. A first through-hole through which fasteners penetrate is provided on the positioning lug 432 in a penetrating manner, and a second through-hole through which fasteners penetrate is provided on each of the connecting lugs 4112 in a penetrating manner.

Preferably, several connecting raised columns 111, which are connected with each of the fasteners, respectively, are protruded in the housing 1, and the connecting raised columns 111 are provided with connecting holes connected with the fasteners. The number of the connecting raised columns 111 is the same as those of the connecting lugs 4112 and the fasteners, and each of the connecting raised columns 111 is aligned with each of the connecting lugs 4112, respectively.

Preferably, three connecting lugs 4112, three connecting lugs 111 and three fasteners are provided, and one positioning lug 432 is provided, in which one of the fasteners is fastened to the housing 1 through one of the connecting lugs 4112 and the positioning lug 432, and two other fasteners are fastened to the housing 1 through two other connecting lugs 4112, respectively. Three connecting lugs 4112, three connecting lugs 111 and three fasteners are provided so as to ensure the stability of mounting the circuit board 411 in the housing 1; however, since the light guide 43 may be compressed and limited by the circuit board 411, only one positioning lug 432 is provided here. On the premise of ensuring the stability of mounting the light guide 43, it may be beneficial to simplifying the structure of the light guide 43 and reducing the difficulty of mounting and positioning the light guide 43 and the circuit board 411 in the housing 1 due to manufacturing errors. Of course, in addition to the preferred embodiments listed here, the numbers of the connecting lugs 4112, the connecting raised columns 111, the fasteners and the positioning lugs 432 may be set to other values in specific applications.

Preferably, the housing 1 comprises a front housing 11 having a cavity and a rear cover 12 mounted on the rear side of the front housing 11 in a covering manner, the backlight module 4 is mounted in the cavity, and the knob 2 and the index dial 3 are exposed on a front surface of the front housing 11 opposite to the rear cover 12. Here, the housing 1 is divided into two parts: the front housing 11 and the rear housing 12. This design and manufacturing may be beneficial to simplifying the manufacturing difficulty of the housing 1 and beneficial to mounting the components in the housing 1.

Further, the embodiment of the present application further provides an instrument, which has the backlight structure of the instrument knob 2 described above. The instrument provided by the embodiment of the present application may facilitate the use of the instrument in a dark environment and improve the aesthetic appearance of the instrument because of adopting the backlight structure of the instrument knob 2 described above.

Preferably, the meter is a multimeter or a clamp meter. In this way, since the multimeter or the clamp meter has the backlight structure of the instrument knob 2 described above, the convenience of use of the multimeter or the clamp meter in a dark environment is improved, and a dazzling appearance of the multimeter or the clamp meter is improved.

The above description is only the preferred embodiment of the present application, and not intended to limit the present application. Any modification, equivalent replacement and improvement made within the spirit and principle of the present application should be included within the scope of protection of the present application.

What is claimed is:

1. An instrument knob backlight structure, comprising:
a housing,
a knob provided outside the housing,
an index dial provided on the periphery of the knob, and
a backlight module mounted inside the housing and provided adjacent to the index dial,
wherein the backlight module comprises a light source component, a light-transmittable element and a light guide provided between the light source component and the light-transmittable element, and the index dial is provided at the outer surface of the light-transmittable element facing outward of the housing
wherein the housing is provided with a mounting opening, and the light-transmittable element is snapped in position into the mounting opening,
wherein the light-transmittable element comprises an outer ring light-transmittable substrate that is snapped in the mounting opening and a boss that extends along the outer ring light-transmittable substrate toward the inside of the housing, and the index dial is provided on the outer surface of the outer ring light-transmittable substrate facing outward of the housing,
wherein the light guide comprises a ring-shaped light guide substrate sleeved outside of the boss and provided opposite to the outer ring light-transmittable substrate, and a positioning lug protruding from the periphery of the ring-shaped light guide substrate,
wherein the light source component comprises a circuit board and an LED lamp provided on the circuit board, and the circuit board is fastened to the housing by several fasteners and compresses the light guide, and
wherein the circuit board comprises a ring-shaped circuit substrate sleeved outside of the boss and several connecting lugs protruding from the periphery of the ring-shaped circuit substrate at intervals, the LED lamp is provided on the ring-shaped circuit substrate, and the fastener is fastened to the housing through the connecting lugs and the positioning lug.

2. The instrument knob backlight structure according to claim 1, wherein three connecting lugs and three fasteners are provided, and one positioning lug is provided, in which one of the fasteners is fastened to the housing through one of the connecting lugs and the positioning lug, and two other fasteners are fastened to the housing through two other connecting lugs, respectively.

3. The instrument knob backlight structure according to claim 2, wherein the housing comprises a front housing having a cavity and a rear cover mounted on the rear side of the front housing in a covering manner, the backlight module is mounted in the cavity, and the knob and the index dial are exposed at a front surface of the front housing facing away from the rear cover.

4. The instrument knob backlight structure according to claim 1, wherein the housing comprises a front housing having a cavity and a rear cover mounted on the rear side of the front housing in a covering manner, the backlight module is mounted in the cavity, and the knob and the index dial are exposed at a front surface of the front housing facing away from the rear cover.

5. An instrument, comprising: the instrument knob backlight structure according to claim 1.

6. The instrument according to claim 5, wherein the instrument is a multimeter or a clamp meter.

7. The instrument according to claim 5, wherein three connecting lugs and three fasteners are provided, and one positioning lug is provided, in which one of the fasteners is fastened to the housing through one of the connecting lugs and the positioning lug, and two other fasteners are fastened to the housing through two other connecting lugs, respectively.

8. The instrument according to claim 5, wherein the housing comprises a front housing having a cavity and a rear cover mounted on the rear side of the front housing in a covering manner, the backlight module is mounted in the cavity, and the knob and the index dial are exposed at a front surface of the front housing facing away from the rear cover.

* * * * *